(12) United States Patent
Guan

(10) Patent No.: US 8,373,077 B2
(45) Date of Patent: Feb. 12, 2013

(54) ELECTRONIC DEVICE ENCLOSURE

(75) Inventor: Zhi-Bin Guan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 270 days.

(21) Appl. No.: 12/869,711

(22) Filed: Aug. 26, 2010

(65) Prior Publication Data

US 2012/0024594 A1 Feb. 2, 2012

(30) Foreign Application Priority Data

Jul. 29, 2010 (TW) .............................. 99125037 A

(51) Int. Cl.
*H05K 7/20* (2006.01)

(52) U.S. Cl. ........................................ 174/547; 454/184

(58) Field of Classification Search .................. 174/383, 174/547; 454/184
See application file for complete search history.

(56) References Cited

U.S. PATENT DOCUMENTS

| | | | | |
|---|---|---|---|---|
| 5,910,639 A * | 6/1999 | Kunkel | ........................ | 174/383 |
| 6,252,161 B1 * | 6/2001 | Hailey et al. | .................. | 174/383 |
| 6,384,325 B1 * | 5/2002 | Chastain et al. | ............. | 174/383 |
| 7,430,117 B2 * | 9/2008 | Shabany | ....................... | 361/695 |
| 2006/0089096 A1 * | 4/2006 | Wolm | ........................... | 454/184 |

* cited by examiner

*Primary Examiner* — Hung Ngo
(74) *Attorney, Agent, or Firm* — Altis Law Group, Inc.

(57) ABSTRACT

An electronic device enclosure includes a side panel defining a number of vents. Each vent is sandwiched by two adjacent partition members for preventing moisture penetrating the enclosure. Each of the partition members includes a plate, a first block perpendicularly extending from a first end of the plate, and a second block perpendicularly extending from a second end of the plate opposite to the first end. The first and second blocks extend in opposite directions.

10 Claims, 3 Drawing Sheets

ELECTRONIC DEVICE ENCLOSURE

BACKGROUND

1. Technical Field

The present disclosure relates to an electronic device enclosure.

2. Description of Related Art

Generally speaking, an electronic device includes electronic elements installed in an enclosure. The electronic elements may generate a large amount of heat during operation. The heat must be quickly removed to prevent the electronic elements from becoming unstable or being damaged. Typically, the enclosure defines a number of vents for ventilation. However, moisture may penetrate through the vents and cause short-circuits.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
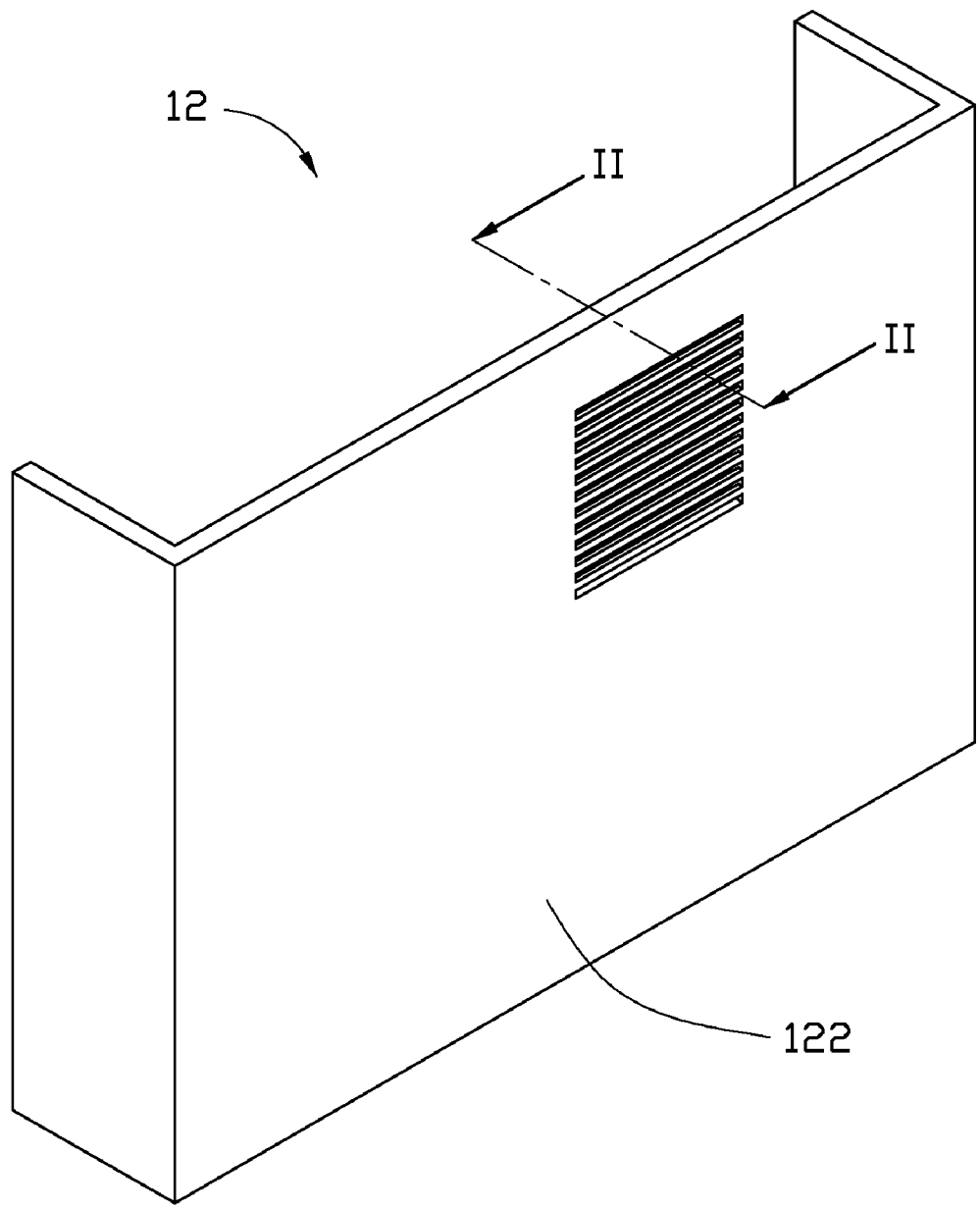
FIG. 1 is an isometric view of an embodiment of a side panel of an electronic device enclosure, the side panel defining a plurality vents.
Figure 2:
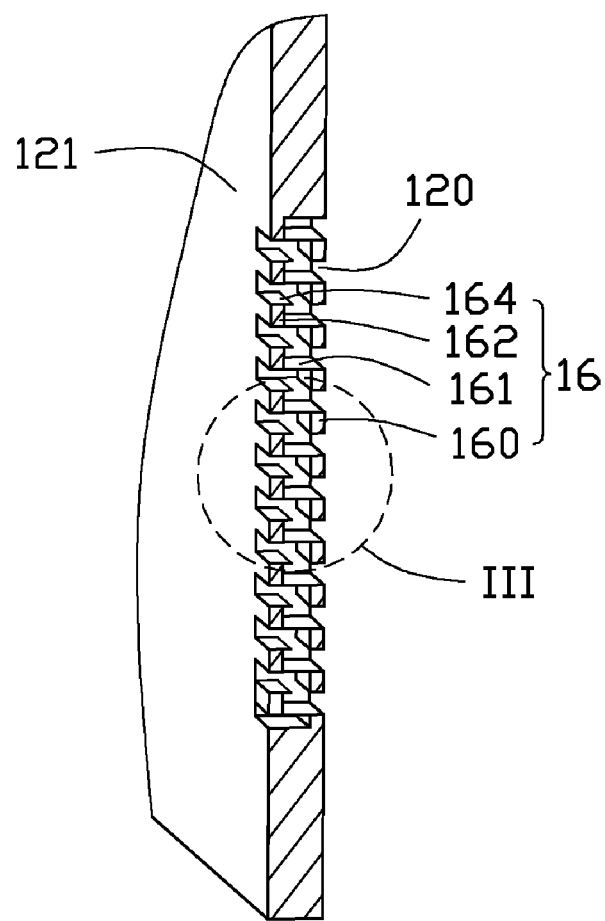
FIG. 2 is a portion of a sectional view taken along line II-II of FIG. 1.
Figure 3:
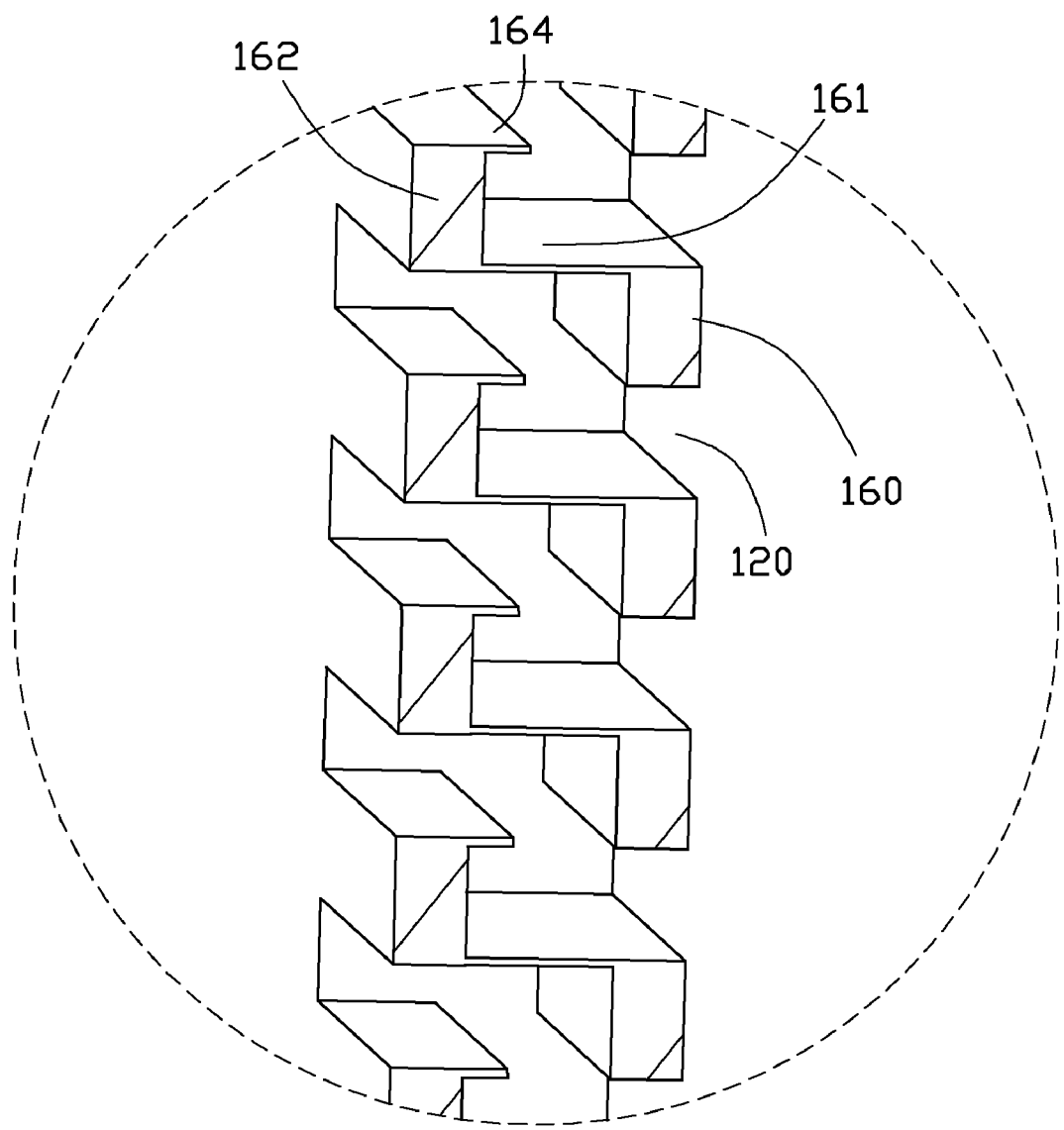
FIG. 3 is an enlarged view of the circled portion III of FIG. 2.

Referring to FIGS. 1-3, an embodiment of an electronic device enclosure includes a side panel 12. The side panel 12 includes an inner surface 121 and an outer surface 122. The side panel 12 defines a plurality of vents 120 therethrough. Each vent 120 is sandwiched by two adjacent partition members 16. Each partition member 16 includes a plate 161, a first bock 160, and a second block 162. The first bock 160 perpendicularly extends from the first end of the plate 161 and is positioned on the outer surface 122. The second block 162 perpendicularly extends from a second end of the plate 161 opposite to the first end, and is positioned on the inner surface 121. The first and second blocks 160, 162 extend in opposite directions. Thus, as seen in the cross section taken along line II-II, each vent 120 is substantially Z-shaped.

A distal end of each second block 162 opposite to the plate 161 is bent toward the outer surface 122 to form a third block 164. The third block 164 is perpendicular to the second block 162.

A projection of the first block 160 of one partition member 16 projected onto a plane of the inner surface 121 of the side panel 12 partly overlaps a projection of the second and third blocks 162, 164 of a next lower partition member 16 projected on the plane of the inner surface 121. In another embodiment, the bottom of the first block 160 of one partition member 16 aligns with the top of third block 164 of the next lower partition member 16.

In use, heat generated by electronic elements installed in the enclosure of the electronic device is dissipated out though the vents 120. Should moisture contact the side panel 12, it will be blocked from penetrating the enclosure by the second and third blocks 162, 164.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure, the enclosure comprising:
   a side panel defining a plurality of vents, wherein each of the plurality of vents is sandwiched by two adjacent partition members for preventing moisture from penetrating the enclosure, each of the partition members comprising:
   a plate;
   a first block perpendicularly extending from a first end of the plate; and
   a second block perpendicularly extending from a second end of the plate opposite to the first end;
   wherein the first and second blocks extend in opposite directions; and
   wherein a projection of the first block of one of the two adjacent partition members projected onto a plane of the inner surface of the side panel partly overlaps a projection of the second block of the other one of the two adjacent partition members projected on the plane of the inner surface.

2. The electronic device enclosure of claim 1, wherein the first block of one of the two adjacent partition member and the second block of the other one of the two adjacent partition member forms a substantially Z shaped vent.

3. The electronic device enclosure of claim 1, wherein the first and second blocks are positioned on an outer surface and the inner surface of the side panel, respectively.

4. The electronic device enclosure of claim 3, wherein each of the partition members further comprises a third block protruding from a distal end of the second block opposite to the plate, and toward the outer surface of the side panel.

5. The electronic device enclosure of claim 4, wherein the projection of the first block of one of the two adjacent partition members projected onto the plane of the inner surface of the side panel partly overlaps a projection of the third block of the other one of the two adjacent partition members projected on the plane of the inner surface.

6. An electronic device enclosure comprising:
   a side panel defining a plurality of vents,
   wherein the section of each of vents is Z-shaped to prevent moisture from penetrating the enclosure;
   wherein each of the plurality of vents is sandwiched by two adjacent partition members each comprising, a plate, a first block perpendicularly extending from a first end of the plate, and a second block perpendicularly extending from a second end of the plate opposite to the first end, wherein the first and second blocks extend in opposite directions; and wherein a projection of the first block of one of the two adjacent partition members projected onto a plane of the inner surface of the side panel partly overlaps a projection of the second block of the other one of the two adjacent partition members projected on the plane of the inner surface.

7. The electronic device enclosure of claim 6, wherein the first and second blocks are positioned on an outer surface and inner surface of the side panel, respectively.

8. The electronic device enclosure of claim 7, wherein each of partition members further comprises a third block protruding from a distal end of the second block opposite to the plate, and toward the outer surface of the side panel.

9. The electronic device enclosure of claim 8, wherein the projection of the first block of one of the two adjacent partition members projected onto the inner surface of the side panel partly overlaps a projection of the third block of the other one of the two adjacent partition members below the first one of the partition members projected on the inner surface.

10. An electronic device enclosure, the enclosure comprising:
- a side panel defining a plurality of vents, wherein each of the plurality of vents is sandwiched by two adjacent partition members for preventing moisture from penetrating the enclosure, each of the partition members comprising:
- a plate;
- a first block perpendicularly extending from a first end of the plate; and
- a second block perpendicularly extending from a second end of the plate opposite to the first end;
- wherein the first and second blocks extend in opposite directions, the first and second blocks are positioned on an outer surface and the inner surface of the side panel, respectively, each of the partition members further comprises a third block protruding from a distal end of the second block opposite to the plate, and toward the outer surface of the side panel.

* * * * *